United States Patent
Umehara (10) Patent No.: US 9,402,017 B2
(45) Date of Patent: Jul. 26, 2016

(54) ELECTRONIC DEVICE AND COMMUNICATION APPARATUS

(71) Applicant: Hideaki Umehara, Kanagawa (JP)

(72) Inventor: Hideaki Umehara, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 59 days.

(21) Appl. No.: 14/219,500

(22) Filed: Mar. 19, 2014

(65) Prior Publication Data

US 2014/0285711 A1    Sep. 25, 2014

(30) Foreign Application Priority Data

Mar. 25, 2013   (JP) ................ 2013-061354

(51) Int. Cl.
| | |
|---|---|
| *H04N 5/225* | (2006.01) |
| *H05K 1/02* | (2006.01) |
| *H04M 1/02* | (2006.01) |
| *H01L 23/34* | (2006.01) |

(52) U.S. Cl.
CPC ........... *H04N 5/2252* (2013.01); *H04M 1/0264* (2013.01); *H05K 1/021* (2013.01); *H01L 23/34* (2013.01)

(58) Field of Classification Search
None
See application file for complete search history.

(56) References Cited

U.S. PATENT DOCUMENTS

| | | | | |
|---|---|---|---|---|
| 5,991,155 A * | 11/1999 | Kobayashi | .......... | H01L 23/3672 165/80.2 |
| 5,995,370 A * | 11/1999 | Nakamori | ............ | H01L 23/367 165/185 |
| 6,011,690 A * | 1/2000 | Hughes et al. | ................ | 361/704 |
| 2005/0111185 A1* | 5/2005 | Bhattacharya et al. | ....... | 361/690 |
| 2006/0176672 A1* | 8/2006 | Kamemoto | .......... | H05K 7/2049 361/714 |
| 2006/0274500 A1* | 12/2006 | Nagayumi | .......... | H01L 23/3677 361/688 |
| 2009/0075515 A1* | 3/2009 | Kuwahara | ........... | H01L 23/3735 439/487 |
| 2009/0237537 A1 | 9/2009 | Maruyama et al. | | |
| 2010/0142154 A1* | 6/2010 | Collet et al. | .................. | 361/714 |
| 2011/0075357 A1* | 3/2011 | Tanaka et al. | ............ | 361/679.58 |
| 2011/0298925 A1* | 12/2011 | Inoue et al. | .................... | 348/148 |
| 2012/0168930 A1* | 7/2012 | Sato | ...................... | H01L 23/433 257/698 |
| 2012/0170119 A1 | 7/2012 | Chu et al. | | |
| 2013/0093948 A1* | 4/2013 | Takeshita | ............. | H04N 5/2253 348/374 |
| 2013/0141866 A1* | 6/2013 | Refai-Ahmed | ..... | H01L 23/3672 361/679.54 |
| 2013/0322513 A1* | 12/2013 | Law et al. | ................ | 375/240.01 |
| 2013/0335922 A1* | 12/2013 | Liu | ........................ | H01L 23/36 361/709 |

FOREIGN PATENT DOCUMENTS

| | | |
|---|---|---|
| EP | 2 071 399 A1 | 6/2009 |
| JP | 11-028419 | 2/1999 |
| JP | 2012-235264 | 11/2012 |

OTHER PUBLICATIONS

Extended European Search Report issued on Jul. 8, 2014 in the corresponding Application No. 14160745.7.
U.S. Appl. No. 14/113,712, filed Apr. 26, 2012.

* cited by examiner

*Primary Examiner* — Twyler Haskins
*Assistant Examiner* — Wesley J Chiu
(74) *Attorney, Agent, or Firm* — Oblon, McClelland, Maier & Neustadt, L.L.P (57) ABSTRACT

An electronic device includes a housing that accommodates therein at least one heating element. At least a part of an inner surface of the housing is applied with a heat conductive material. The electronic device may be incorporated in a communication apparatus.

7 Claims, 12 Drawing Sheets

ELECTRONIC DEVICE AND COMMUNICATION APPARATUS

CROSS-REFERENCE TO RELATED APPLICATIONS

This patent application is based on and claims priority pursuant to 35 U.S.C. §119 to Japanese Patent Application No. 2013-061354, filed on Mar. 25, 2013, in the Japan Patent Office, the entire disclosure of which is hereby incorporated by reference herein.

BACKGROUND

1. Technical Field

The present invention generally relates to an electronic device and a communication apparatus, and more specifically to an electronic device having at least one heating element and a communication apparatus having the electronic device.

2. Description of the Related Art

The portable electronic devices are usually provided with a heating element that converts electricity into heat, such as an electronic component. The heat generated by the heating element is transmitted through a metal case having the heating element therein for diffusion, causing the case to have high temperatures. For safety, the outer surface of the case may be covered with a heat insulating material, which may not be desirable in terms of aesthetic attractiveness.

SUMMARY

Example embodiments of the present invention include an electronic device including a housing that accommodates therein at least one heating element. At least a part of an inner surface of the housing is applied with a heat conductive material.

Example embodiments of the present invention include a communication apparatus including the electronic device.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

Referring now to FIGS. 1 to 11, a videoconference apparatus 100, which is one example of communication apparatus, is described according to an example embodiment of the present invention. FIG. 1A is a perspective view illustrating the videoconference apparatus 100 viewed from the top, and FIG. 1B is a perspective view illustrating the videoconference apparatus 100 viewed from the bottom. In this example, the videoconference apparatus 100 is used for sharing information among a plurality of remotely located sites through a communications network such as the Internet, for example, to have conference such as videoconference or teleconference.

Figure 1A:
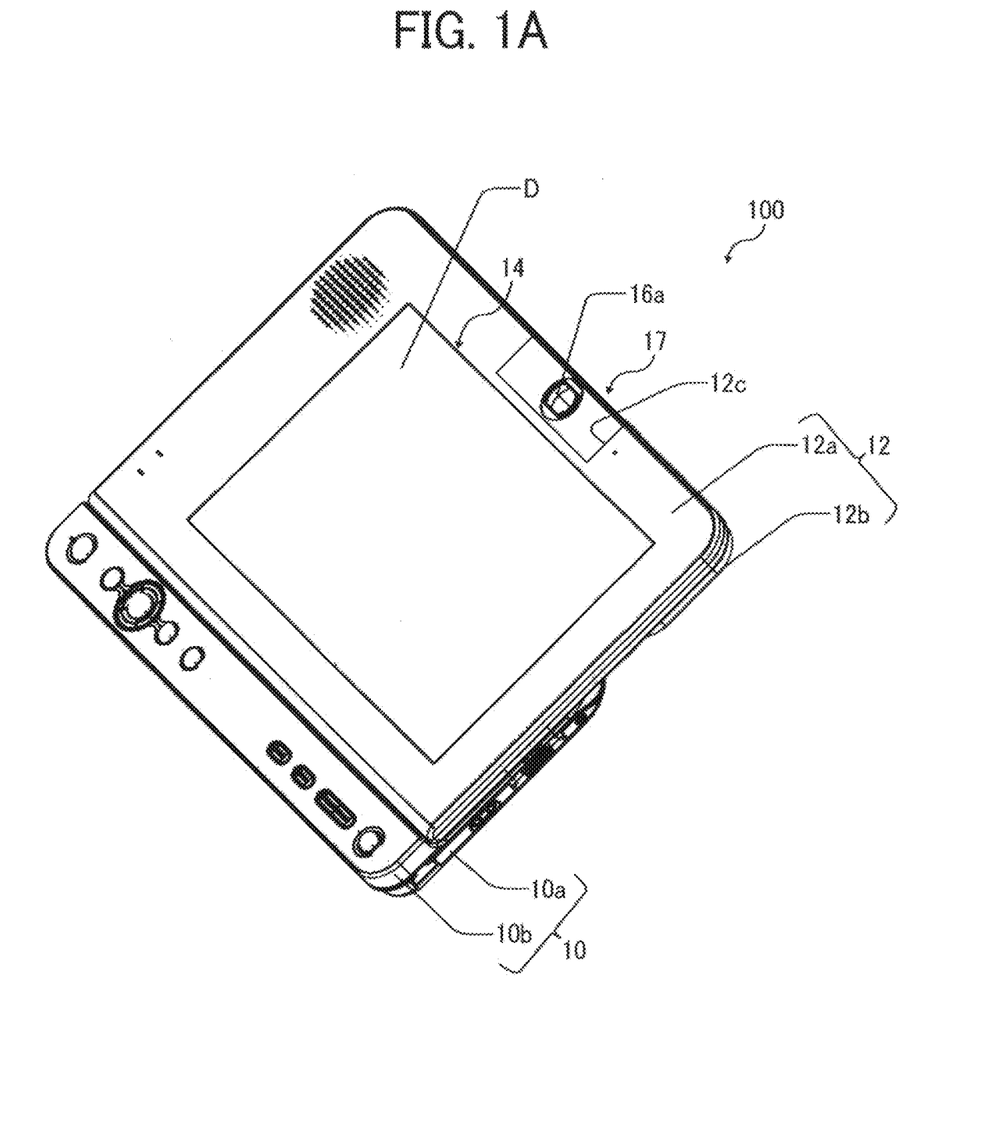
FIGS. 1A and 1B (FIG. 1) are perspective views illustrating a videoconference apparatus viewed from the top and bottom, according to an example embodiment of the present invention.
Figure 1B:
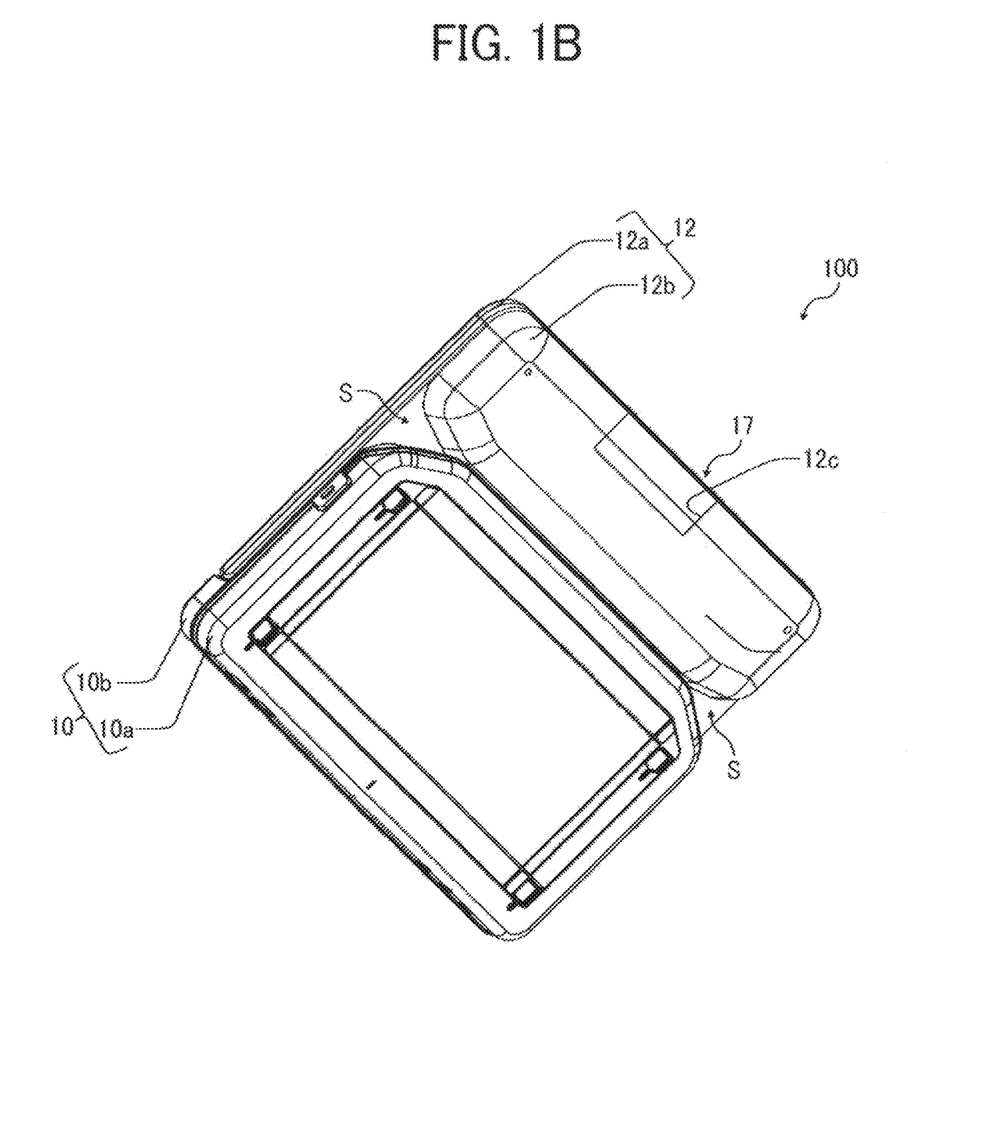

As illustrated in FIGS. 1A and 1B, the videoconference apparatus 100, when it is in a folded-up position ("reference state"), has a rectangular planar shape of about A4 size, with the thickness of about 20 mm to 40 mm.

Figure 11:
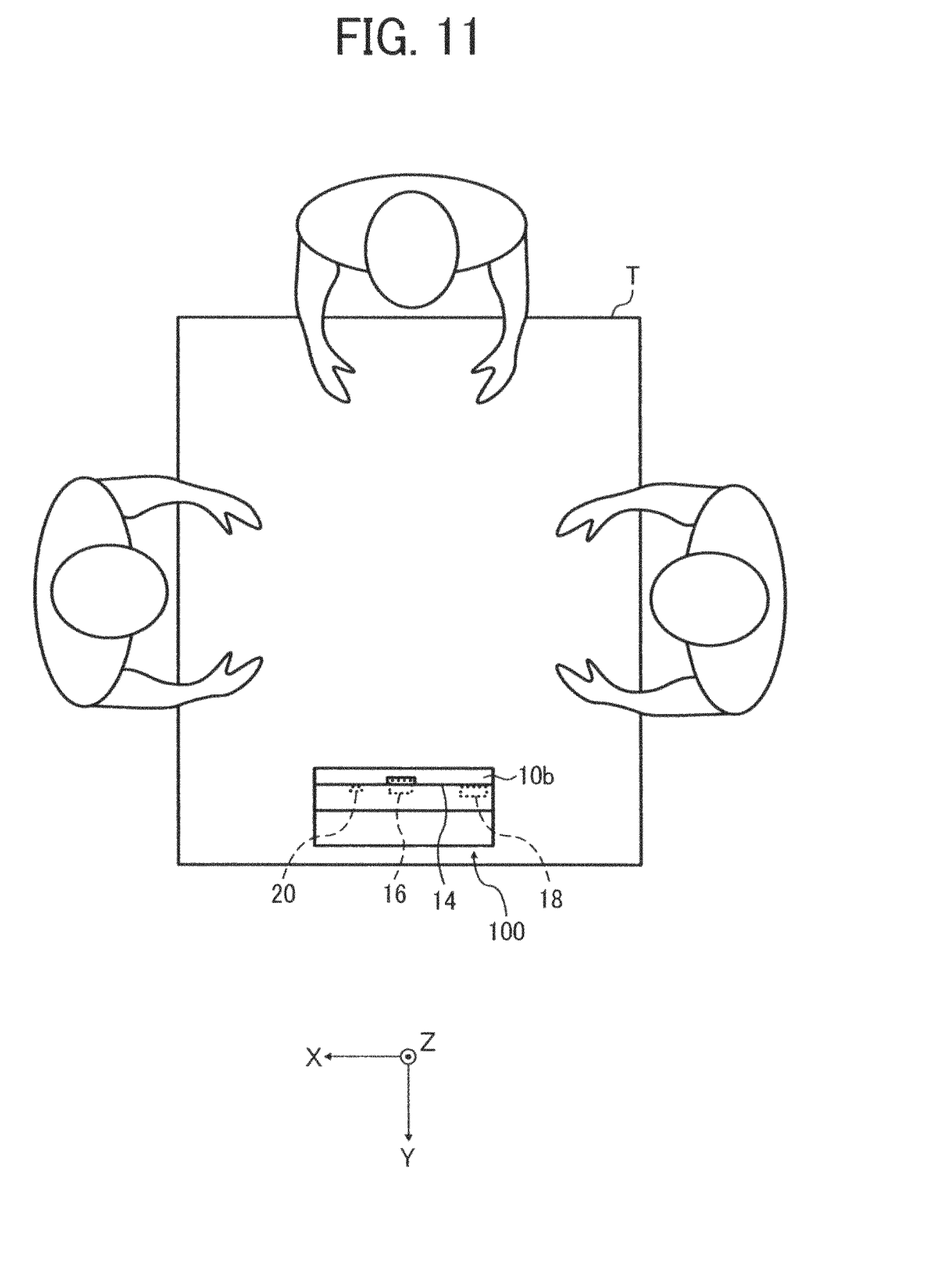
FIG. 11 is an illustration for explaining installation of the videoconference apparatus of FIG. 1, according to an example embodiment of the present invention.

The videoconference apparatus 100 is thus designed to be thin and compact when it is folded. As illustrated referring to FIG. 7, when it is in use, a top surface of the videoconference apparatus 100 is lifted such that the top surface is almost vertical with respect to a surface on which the videoconference apparatus 100 is placed. When it is in use, the videoconference apparatus 100 may be placed on the surface of a desk or a table, as illustrated in FIG. 11. For the descriptive purposes, the videoconference apparatus 100, when it is folded, is referred to as having the reference state. The videoconference apparatus 100 having its top surface lifted, is referred to as having the open state.

Figure 2:
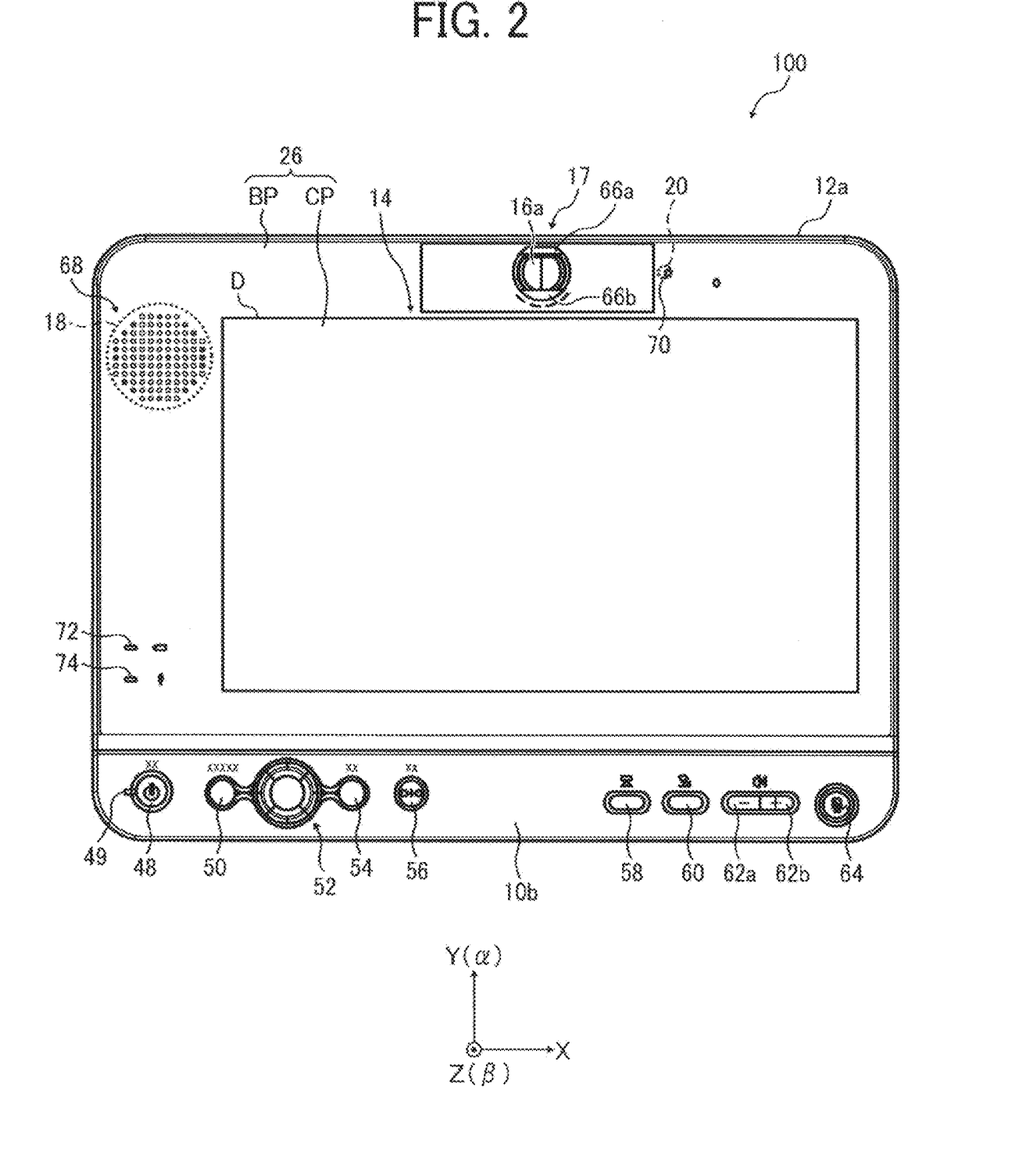
FIG. 2 is a view illustrating the upper surface of the videoconference apparatus of FIG. 1.

FIG. 2 illustrates the top surface of the videoconference apparatus 100 when it is folded and placed on the horizontal surface, viewed from the top. In the following, the longitudinal direction or axis of the videoconference apparatus 100 is indicated by X. The direction or axis orthogonal to X on a horizontal surface is indicated by Y. The direction or axis orthogonal to X and Y is indicated by Z.

Figure 3:
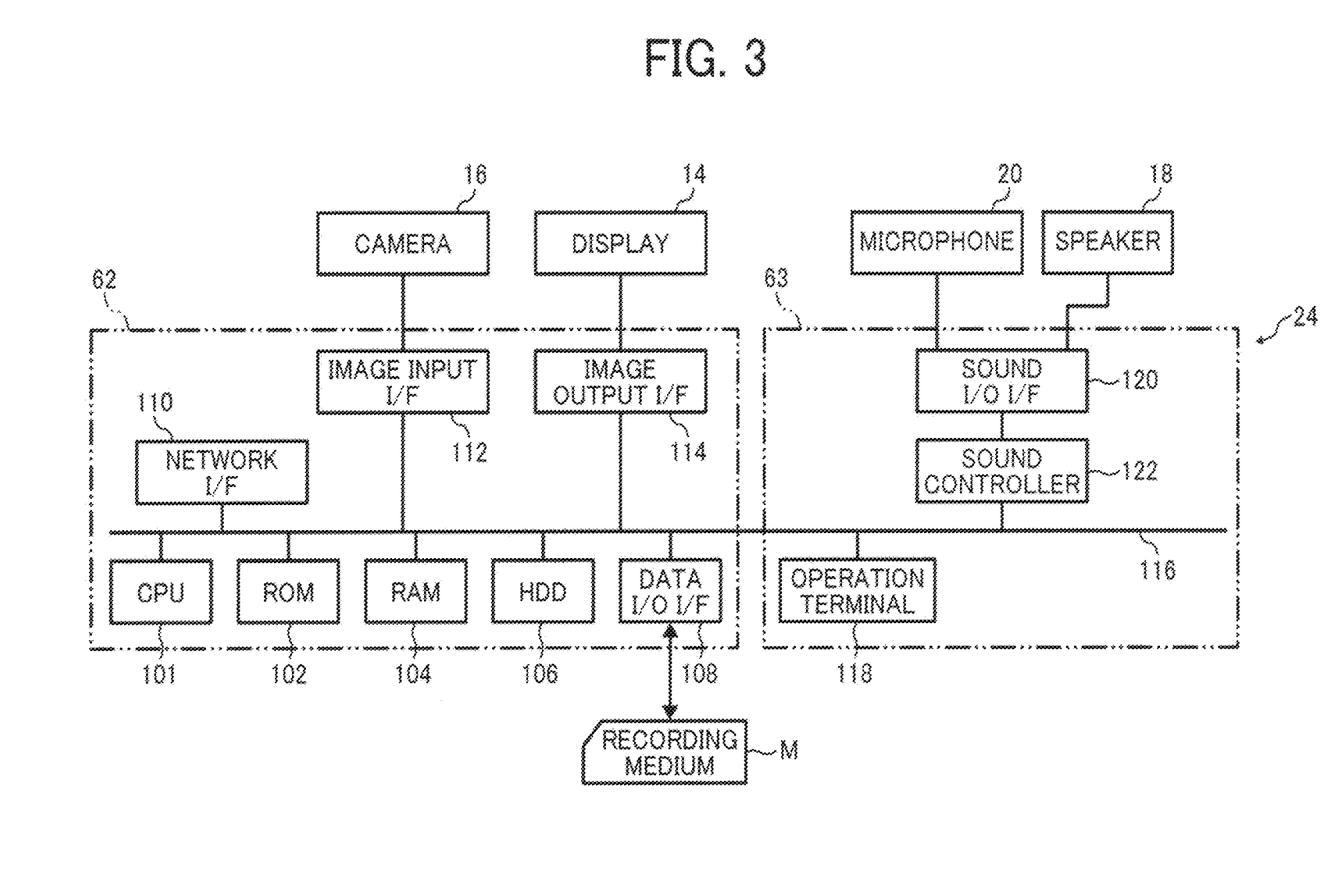
FIG. 3 is a schematic block diagram illustrating a hardware structure of the videoconference apparatus of FIG. 1.

As illustrated in FIGS. 1A, 1B, and 2, the videoconference apparatus 100 includes a first housing 10, a second housing 12, a display 14, a camera module 17 including a camera 16 (FIG. 3), a speaker 18, a microphone 20, and a controller 24 (FIG. 3). In this example, the camera module 17 is one example of electronic device.

As illustrated in FIGS. 1A and 1B, the first housing 10 includes a controller case 10a that accommodates the controller 24 therein, and an operation panel 10b provided with a plurality of operation devices such as operation keys. The first housing 10 has a thin rectangular shape such that it can be placed flat.

The controller 24 controls transmission or reception of image data or sound data through a network such as the Internet, for example, by encoding or decoding the image data and the sound data.

As illustrated in FIG. 3, the controller 24 includes a main board 62 that functions as a controller circuit, and a sub-board 63 that functions as a sound processing circuit and/or an operation circuit.

In this example, referring to FIG. 3, the main board 62 includes a central processing unit (CPU) 101, a read only memory (ROM) 102, a random access memory (RAM) 104, a hard disk drive (HDD) 106, a data input/output (I/O) interface (I/F) 108, a network I/F 110, an image input I/F 112, and an image output I/F 114. The HDD 106 may be replaced by any desired storage or recording memory or medium. The CPU 101, ROM 102, RAM 104, HDD 106, data I/O I/F 108, and network I/F 110 are connected through a bus line 116 such as a data bus to communicate various data such as image data with one another. Examples of image data include a moving image, and an intermittent image that is a sequence of still images taken for a predetermined time period.

The CPU 101 controls entire operation of the videoconference apparatus 100 according to specific program, such as videoconference control program. For example, the CPU 101 controls communication of sound data and/or image data through the network such as the Internet, according to the videoconference control program.

The ROM 102 stores various programs such as an initial program loader (IPL). The RAM 104 functions as a work area for the CPU 101.

The HDD 106 stores various programs such as the videoconference control program, and various data such as image data or sound data. In alternative to the HDD 106, any desired memory such as a solid state drive (SSD) may be used. The videoconference control program is stored in a computer installable or executable file format. For example, the videoconference control program may be stored in a recording medium readable by a computer for distribution.

In alternative to storing the videoconference control program in the HDD 106, the ROM 102 may store the videoconference control program.

Under control of the CPU 101, the HDD 106 controls reading or writing of various data to the HDD 106.

The data I/O I/F 108 controls reading or writing of data with respect to a recording medium M such as a flash memory connected to one of a plurality of USB terminals. The data I/O I/F 108 may control transmission of data, which is obtained from a personal computer (PC) connected to a USB terminal, to a videoconference apparatus at the other end.

The recording medium M can be freely inserted to or removed from one of the plurality of USB terminals. Alternatively, the recording medium M may be implemented by a SD memory or a compact flash memory that may be directly attached to the USB terminal. In such case, a memory drive may be attached to or removed from the USB terminal. In alternative to the flash memory, the recording medium M may be implemented by any desired nonvolatile memory such as Electrical Erasable and Programmable ROM (EEPROM), as long as data can be read from or write onto the medium M under control of the CPU 101.

The network I/F 110 includes a LAN terminal 38 (FIG. 4), such as the Ethernet-based terminal. The network I/F 110 transmits or receives, or inputs or outputs, various data such as image data or sound data through the Internet. The network I/F 110 thus functions as an image data sender. The network I/F 110 may be connected to a wired LAN terminal, or wireless LAN terminal.

The image input I/F 112 inputs an image signal of an object, output from the camera 16, as image data. The image output I/F 114 converts various data such as image data to an analog or digital image signal for output through a display. Examples of data for output include, but not limited to: data of a menu screen displaying various operation icons including the icon to select a destination videoconference apparatus 100 at a remotely located site, the icon to adjust image quality, or the icon to select the output signal; encoded image data selected from data received through the Internet; and image data captured by the camera 16. Examples of display include, but not limited to, the display 14, a monitor connected to the image output terminal 42, television, and projector. For example, the CPU 101 decodes the encoded image data using a predetermined codec to output as an image signal of a specific type. The image signal may be output, for example, as an analog RGB signal (VGA), a component video signal, a high-definition multimedia interface (HDMI) signal, or a digital video interactive (DVI) signal.

The sub-board 63 includes a plurality of operation terminals 118 ("operation terminal 118") such as a plurality of operation keys, a sound input/output (I/O) I/F 120, and a sound controller 122. The operation terminal 118 and the sound controller 112 are connected through the bus line 116 to communicate with each other. The operation terminal 118 and the sound controller 112 are further connected to other devices mounted on the main board 62 through the bus line 116 to communicate with the devices on the main board 62.

The sound I/O I/F 120 is input with a sound signal through the microphone 20 as sound data of a predetermined format, and sends the sound data to the sound controller 122. The sound I/O I/F 120 converts sound data received through the network I/F 110 and the sound controller 122, to a sound signal in a format that can be output by the speaker 18.

The sound controller 122 adjusts a volume of sounds to be output through the speaker 18, according to operation performed on a pair of volume keys 62a and 62b (FIG. 2).

The sound controller 112 switches between the on state and the mute state of the microphone 20, according to operation of turning on or off a microphone mute key 64 (FIG. 2).

The sound controller 112 is further provided with an echo canceller and a noise canceller. The echo canceller removes echo or audio feedback, which may occur while two-way communication is being performed between the communication apparatus 100 at one end and the communication apparatus 100 at the other end. Feedback is produced, when a sound signal received by the microphone 20 is passed out of the speaker 18, and the sound output from the speaker 18 is then received by the microphone 20, forming a loop of sound waves. The noise canceller suppresses noise input through the microphone 20, such as an operating sound of an air conditioner in a room.

Figure 4:
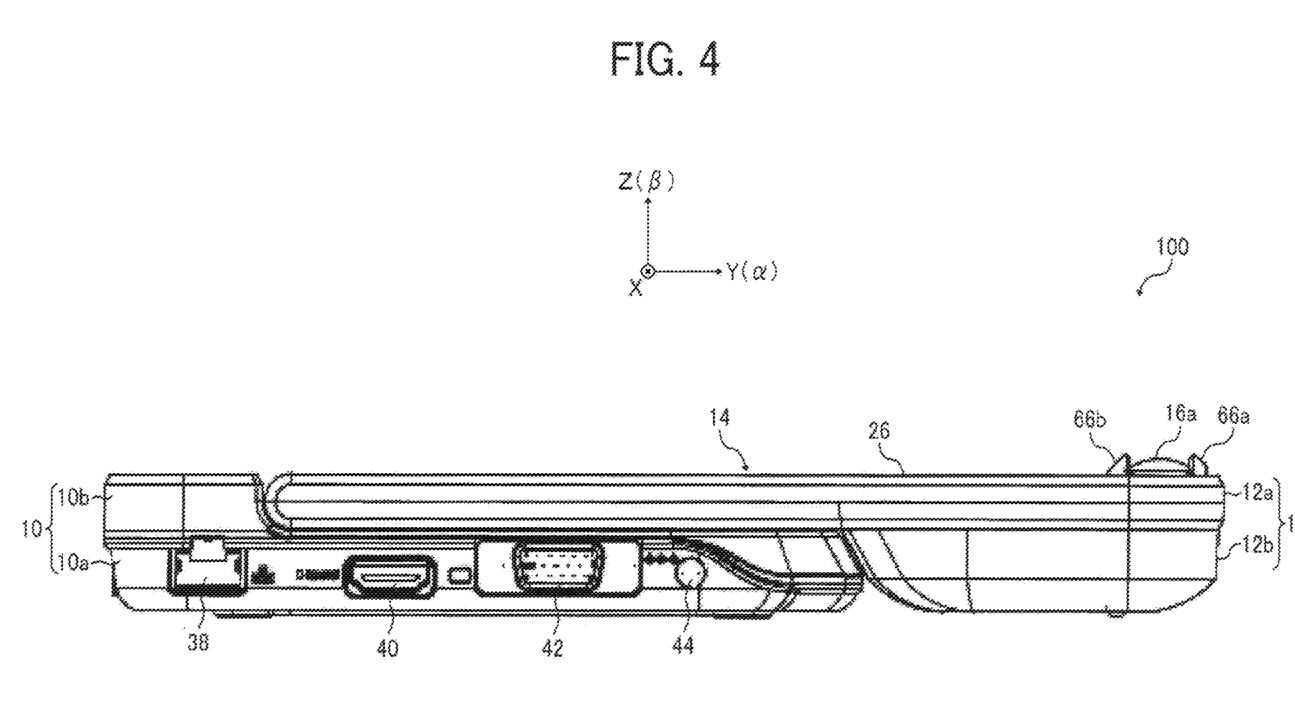
FIG. 4 is a side view illustrating a side surface of the videoconference apparatus of FIG. 1, when the videoconference apparatus is in the reference state.
Figure 5:
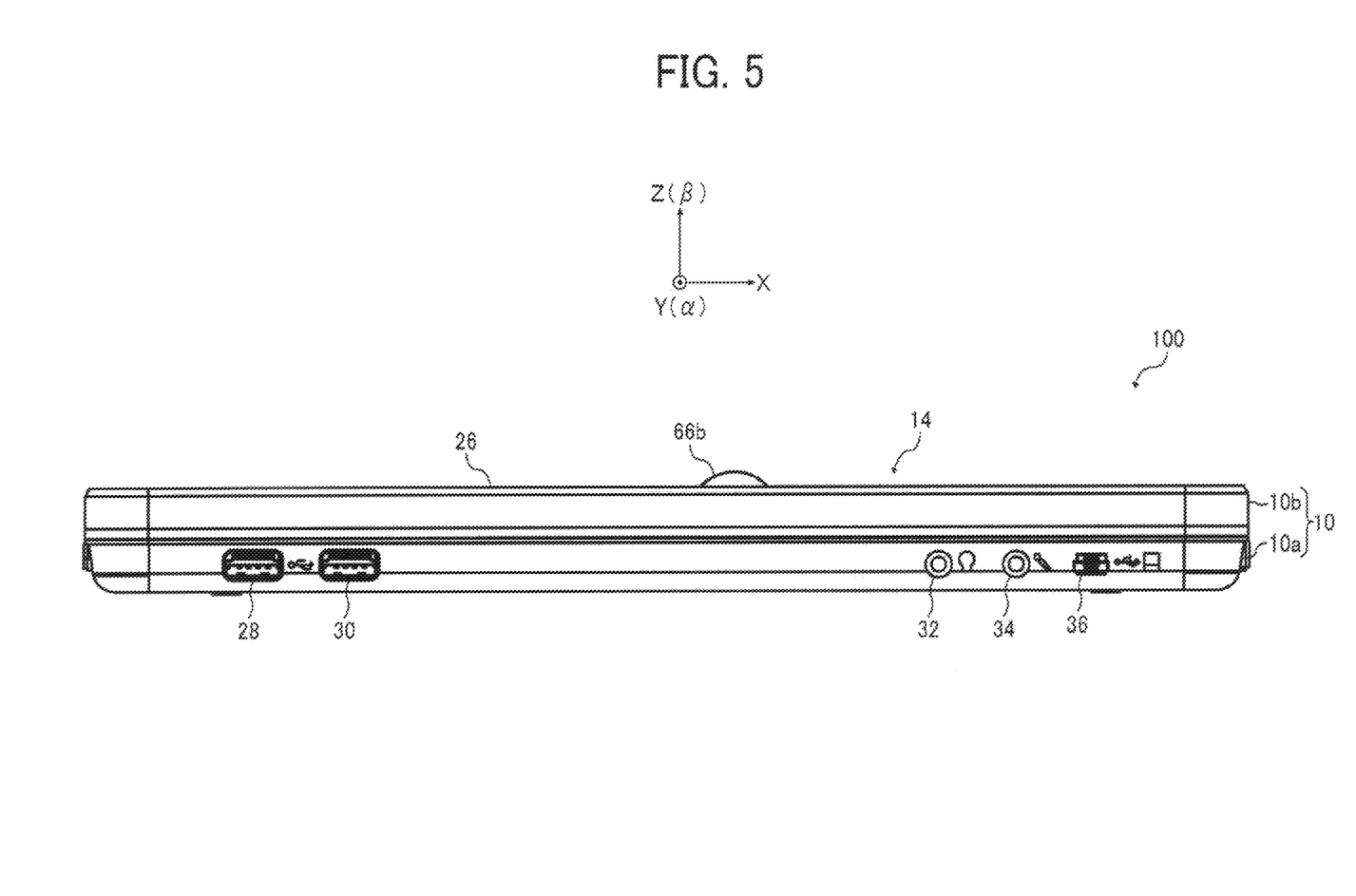
FIG. 5 is a side view illustrating a side surface of the videoconference apparatus of FIG. 1, when the videoconference apparatus is in the reference state.
Figure 6:
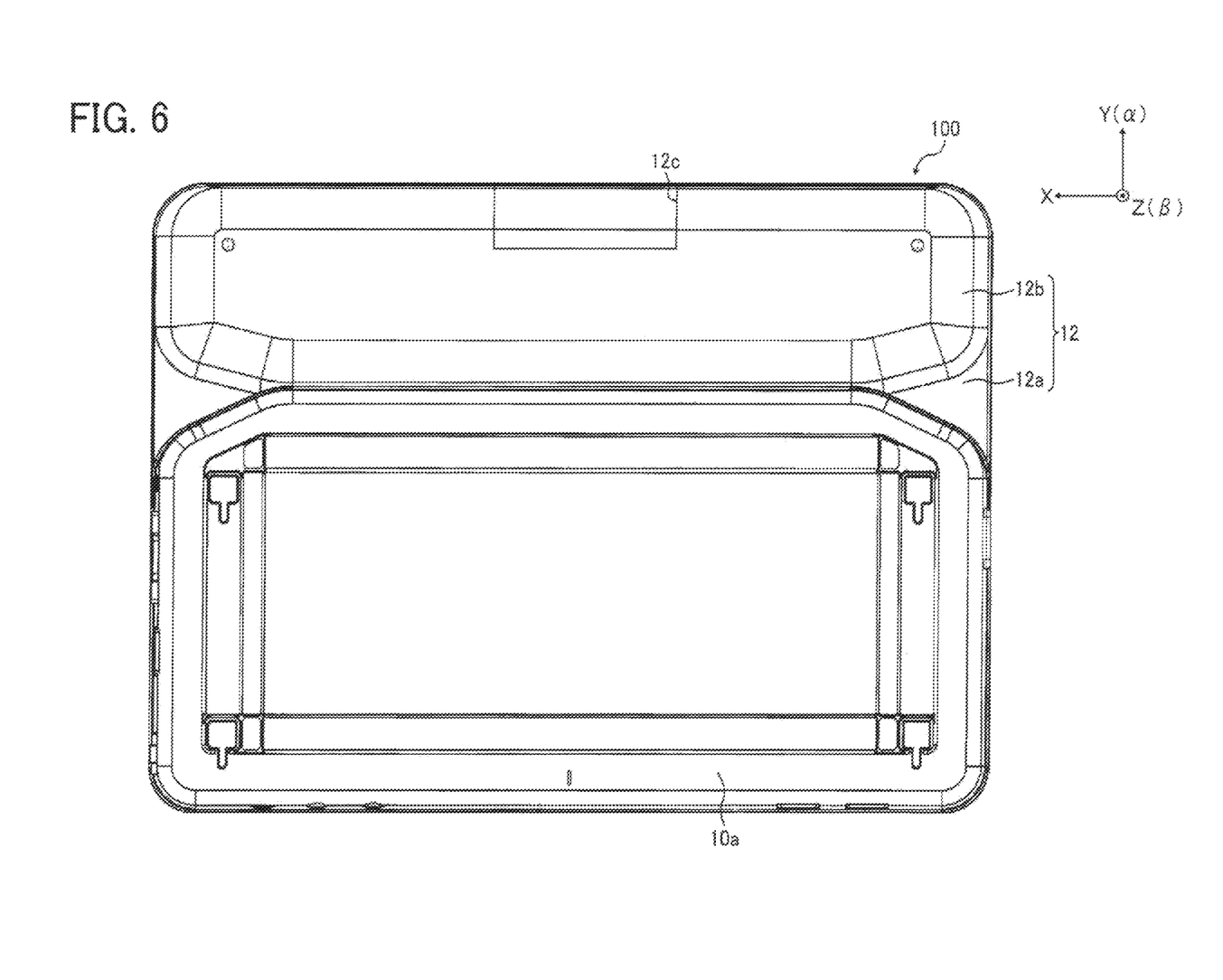
FIG. 6 is a view illustrating a bottom surface of the videoconference apparatus of FIG. 1, when the videoconference apparatus is in the reference state.

As illustrated in FIGS. 4 and 5, the controller case 10a has a box-like shape, with substantially a rectangular planar face extended in a longitudinal direction X. For the descriptive purposes, in the following, the sign "+" and the sign "−" are used to indicate the location on the X, Y, or Z axis. For example, +X side indicates any position or direction in the X axis, which tends to have a higher value relative to the position where the center of the X axis is located. −X side indicates any position or direction in the X axis, which tends to have a lower value relative to the position where the center of the X axis is located.

As illustrated in FIG. 4, the +X side, side wall of the controller case 10a is formed with four openings, from which the LAN terminal 38, an image output terminal 40 in compliance with HDMI standards, the image output terminal 42 in compliance with VGA standards, and an power supply terminal 44 (power jack), which are mounted on the main board 62, are exposed, respectively. In alternative to or in addition to the image output terminals 40 and 42, a DVI-I terminal, a component terminal, a D terminal, a S terminal, or a composite terminal may be provided.

Referring to FIG. 5, the −Y side, side wall of the controller case 10a is formed with two openings at the −X side, edge portion. From these two openings, USB terminals 28 and 30 that are mounted on the main board 62 are exposed, respectively. The −Y side, side wall of the controller case 10a is further formed with three openings at the +X side, edge portion. From these three openings, a headphone connection terminal 32, a microphone connection terminal 34, and a USB terminal 36, which are mounted on the main board 62, are exposed, respectively.

As illustrated in FIGS. 2, 4, and 5, the operation panel 10b has a shape of box, with a long rectangular-like planar face extended in the longitudinal direction X. The operation panel 10b is continued to the +Z side, edge of the −Y side, side wall of the controller case 10a.

As illustrated in FIG. 2, the +Z side, side wall of the operation panel 10b is formed with five openings, arranged in the X axial direction, at the −X side, edge portion. From these five openings, five operation parts are exposed, respectively. In this example illustrated in FIG. 2, a power switch 48, a menu key 50, a curser 52, a confirm key 54, and a disconnect key 56 are provided in this order from −X side to +X side.

The power switch 48, when selected, turns on or off the electric power of the videoconference apparatus 100. To indicate whether the power is on or off, a power lamp 49 is provided near the power switch 48 of the operation panel 10b, which is lighted when the power is turned on.

The menu key 50, when selected, causes the display 14 to display a menu screen.

The curser 52 allows the user to select an item being displayed on the menu screen of the display 14. Through operating the curser 52, the user is able to select the item displayed on the menu screen.

The confirmation key 54, when selected, confirms selection of the item being displayed on the menu screen and selected using the curser 52. For example, the user may select a counterpart videoconference apparatus 100 to have videoconference with using the curser 52, from the menu screen, and confirm such selection by pressing the confirmation key 54.

The disconnect key 56, when selected, disconnects the Internet connection with the counterpart videoconference apparatus 100.

The +Z side, side wall of the operation panel 10b is further formed with five openings, arranged in the X axial direction, at the +X side, edge portion. From these five openings, five operation parts are exposed, respectively. In this example illustrated in FIG. 2, a view switch key 58, a brightness adjust key 60, the pair of volume keys 62a and 62b, and the microphone mute key 64 are provided in this order from −X side to +X side.

The view switch key 58, when selected, switches an image to be transmitted to the counterpart videoconference apparatus 100, which may be selected among images captured by the camera 16. For example, assuming that a plurality of users is participating in videoconference from one site, the user at one site may press the view switch key 58 to select an image of at least one user as an image to be transmitted to the other site.

The brightness adjust key 60, when selected, adjusts the brightness of an image being displayed on the display 14. Through pressing the brightness adjust key 60 according to the brightness of surroundings of the videoconference apparatus 100, the user is able to adjust the brightness of a screen on the display 14 to improve visibility for the user. For example, the brightness adjustment key 60 can adjust the brightness values in "N" steps, with "N" being an integer. By pressing the brightness adjustment key 60, the brightness is made higher or lower in stepwise. When the brightness adjustment key 60 is pressed for "N" times, the brightness value will return to its default brightness value.

The pair of volume keys 62a and 62b adjusts the volume of sounds to be output through the speaker 18. The volume key 62a at the −X side, when selected, reduces the volume of sounds. The volume key 62b at the +X side, when selected, increases the volume of sounds.

The microphone mute key 64 turns on or off the microphone 20. When the microphone 20 is turned on, sounds can be input through the microphone 20. When the microphone 20 is turned off, sounds are not input through the microphone 20.

As illustrated in FIGS. 1A and 1B, the second housing 12 includes a first case 12a that accommodates therein the display 14, a part of the speaker 18, and a part of the microphone 20, and a second case 12b that accommodates therein the remained part of the speaker 18 and the remained part of the microphone 20.

As illustrated in FIGS. 2, 4, and 5, the first case 12a has a shape of box, with a rectangular-like planar face extended in the longitudinal direction X. The first case 12a is provided at the +Z side of the controller case 10a, and at the +Y side of the operation panel 10b. In this example, when the videoconference apparatus 100 is folded, the −Z side of the first case 12a is made in contact with the +Z side of the controller case 10a at least partially.

The first case 12a accommodates the display 14 at its central portion, such that the display 14 is kept in parallel to the XY plane.

In this example, the display 14 includes a liquid crystal display (LCD) panel having a display surface "D" for displaying an image, two electrodes provided so as to sandwich the LCD panel, a liquid crystal structure including two polarizing plates so as to sandwich the two electrodes, and a backlight located at one side of the liquid crystal structure. The display 14, which is a LCD display, has a plate-like shape.

Further, in this example, the +Z side of the first case 12a is formed with a rectangular opening that is slightly larger than the display 14. To the rectangular opening, a cover panel 26 made of reinforced plastics is inserted. The display 14 is thus covered with the cover panel 26 from the +Z side. The cover panel 26 has a transparent portion that faces the display 14, and a black portion surrounding that transparent portion. For the descriptive purposes, the transparent portion of the cover panel 26 is referred to as a clear panel CP, and the black portion of the cover panel 26 is referred to as a black panel BP. The LCD panel of the display 14 is made visible through the clear panel CP from the +Z side.

As illustrated in FIGS. 4 and 5, the second case 12b has a shape of box, with a rectangular-like planar face extended in the longitudinal direction X. The second case 12b is continued to the −Z edge of the +Y side, edge portion of the first case 12a. The second case 12b projects to the −Z side, from the −Z side edge of the first case 12a.

As illustrated in FIG. 2, the speaker 18 is provided at the −X side edge of the +Y edge portion of a space "S" (FIG. 1) formed between the first case 12a and the second case 12b, such that the sounds are output in the +Z direction.

In this example, the speaker 18 is implemented by a full-range type speaker having a circular shape. Alternatively, the speaker 18 may be of any other desired type. The speaker 18 is connected to the sound I/O I/F 120 (FIG. 3), and outputs the sound signal transmitted from the sound I/O I/F 120 as sounds.

The portion of the black panel BP that faces the speaker 18 is formed with a plurality of small through holes, which may be collectively referred to as a sound hole 68 (FIG. 2), to output the sounds from the speaker 18.

The microphone 20 is provided at the +X side relative to the camera 16 of the +Y side edge portion, of a space "S" (FIG. 1) formed between the first case 12a and the second case 12b, such that the sounds are input from the −Z direction.

In this example, the microphone 20 is implemented by a small non-directional type microphone. Alternatively, any directional type microphone may be used. The microphone 20 is connected to the sound I/O I/F 120 (FIG. 3), and transmits input sounds to the sound I/O I/F 120 in the form of a sound signal.

The portion of the black panel BP that faces the microphone 20 is formed with at least one small through hole, which may be referred to as a sound input hole 70, to receive sounds to be input through the microphone 20.

The black panel BP is further provided with a remained power lamp 72 and a connection lamp 74, at the −X and −Y side edge portion. The remained power lamp 72 indicates the remained life of the outside battery. The connection lamp 74 indicates a connection status to the Internet.

Figure 7:
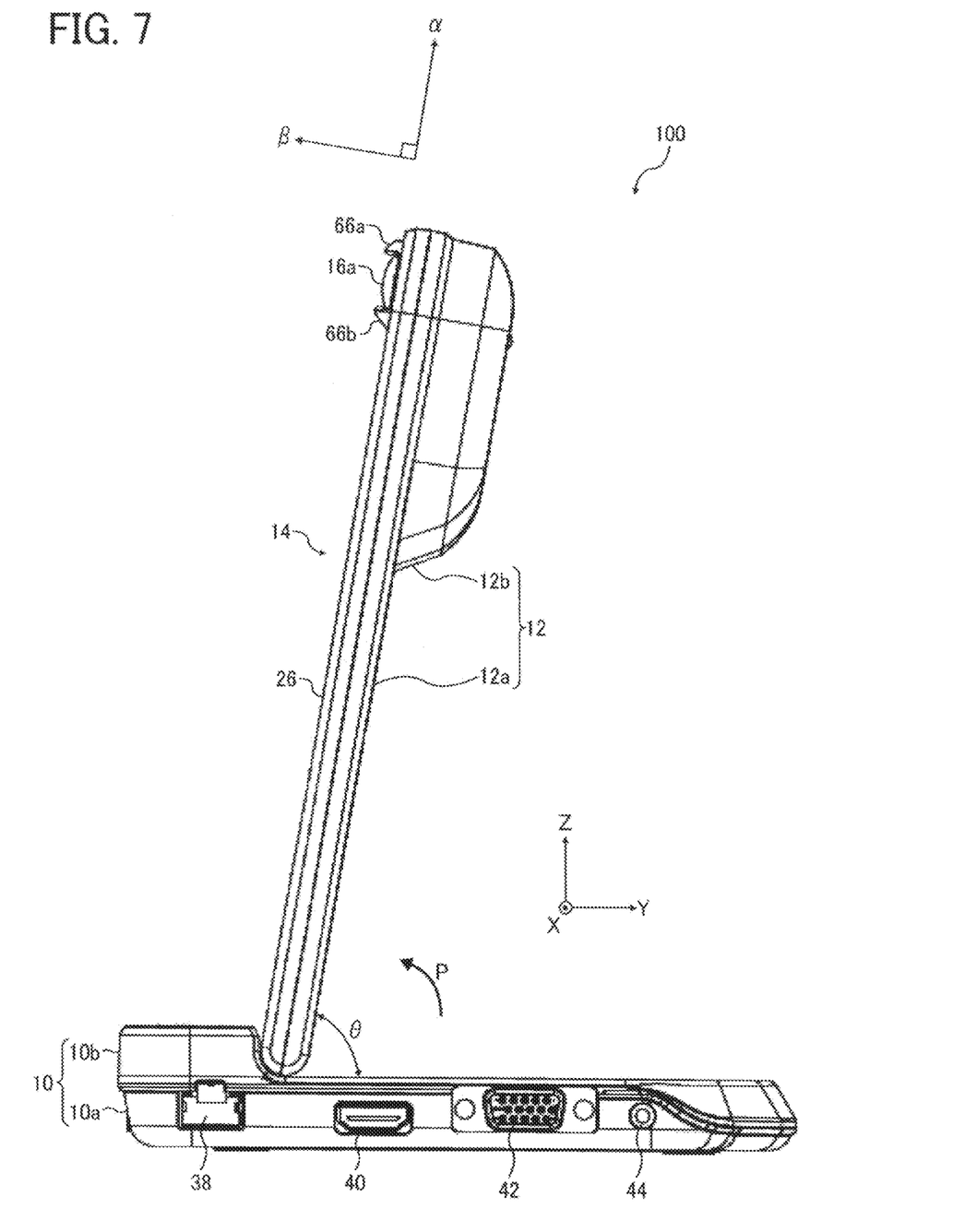
FIG. 7 is a side view illustrating a side surface of the videoconference apparatus of FIG. 1, when the videoconference apparatus is in the open state.

In the following, as illustrated in FIG. 7, α denotes an axis that is orthogonal to the X axis, and is parallel to the cover panel 26. β denotes an axis that is orthogonal to both of the X axis and the α axis. When the videoconference apparatus 100 is in the reference state, the α axis coincides with the Y axis, and the β axis coincides with the Z axis.

The −Y side edge of the first case 12a, that is, −α side edge of the first case 12a, is continued to the first housing 10 via a torque hinge having an axis in the X axial direction. The LCD panel of the display 14 can be viewed from the +β side, while an image capturing lens 16a exposes toward the +β side. The speaker 18 outputs the sounds in the +β direction, and the microphone 20 inputs sounds from the direction.

With the torque hinge, the second housing 12 is rotatable around the X axis, between a contact position at which the second housing 12 is made in contact with the first housing 10 (FIGS. 4 and 5) and a release position from which the second housing 12 is released from the first housing 10. When the second housing 12 is at the release position, the videoconference apparatus 10 is in the open state.

Figure 8:
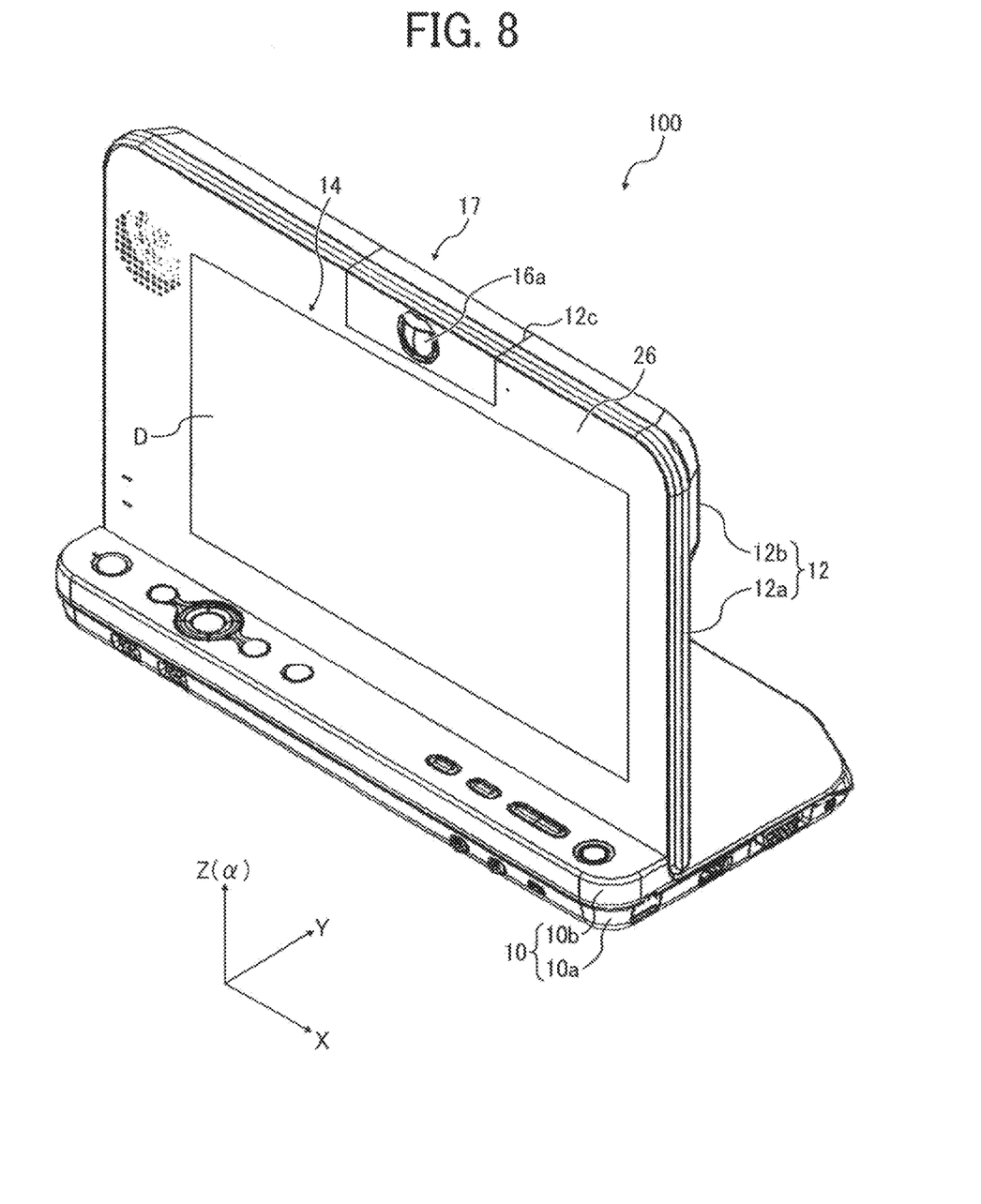
FIG. 8 is a perspective view illustrating the videoconference apparatus of FIG. 1, when the videoconference apparatus is in the open state.

The rotational angle θ of the second housing 12 with respect to the first housing 10 around the X axis is set to 0 degree, when the videoconference apparatus 100 is in the reference state ("folded-up position"), that is, when the second housing 12 is at the contact position. The rotational angle θ may be set at a value between 0 degree and 90 degrees. In FIG. 8, the rotational angle θ is set to 90 degrees, such that the videoconference apparatus 100 is opened at its maximum range. With the torque hinge, the second housing 12 can be held at a specific position to keep the rotational angle θ around the X axis with respect to the first housing 10. When the second housing 12 is at the contact position, the videoconference apparatus 100 is in the reference state.

As illustrated in FIG. 8, the +α side edge of the second housing 12 is formed with a cut portion 12c having a cuboid-like shape, at a center portion in the X axial direction. The cut portion 12c accommodates therein a camera module 17. The camera module 17 is rotatable around the X axial direction with respect to the second housing 12.

Figure 9A:
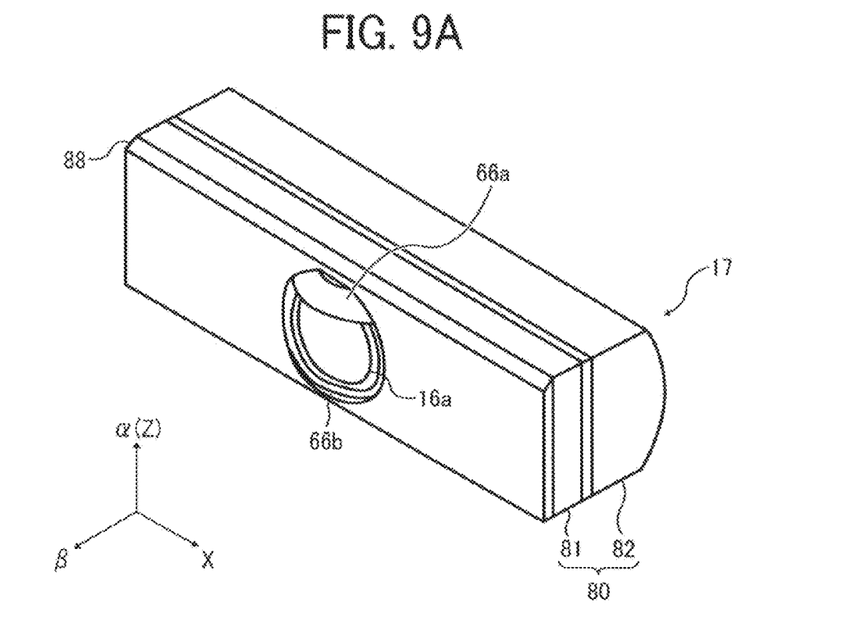
FIGS. 9A and 9B (FIG. 9) are perspective views illustrating a camera module of the videoconference apparatus of FIG. 1.
Figure 9B:
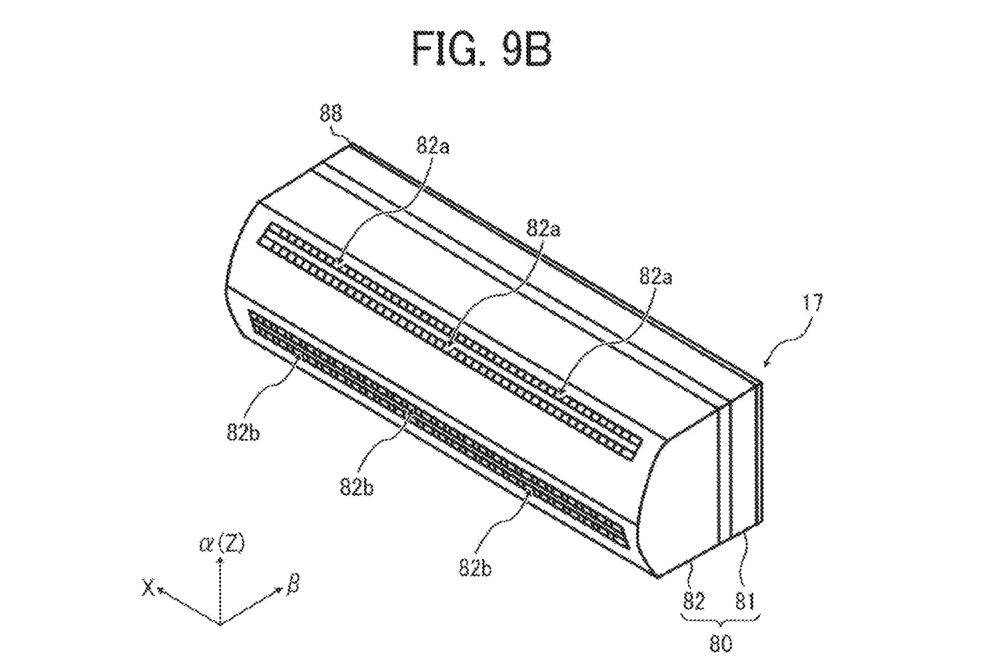
Figure 10:
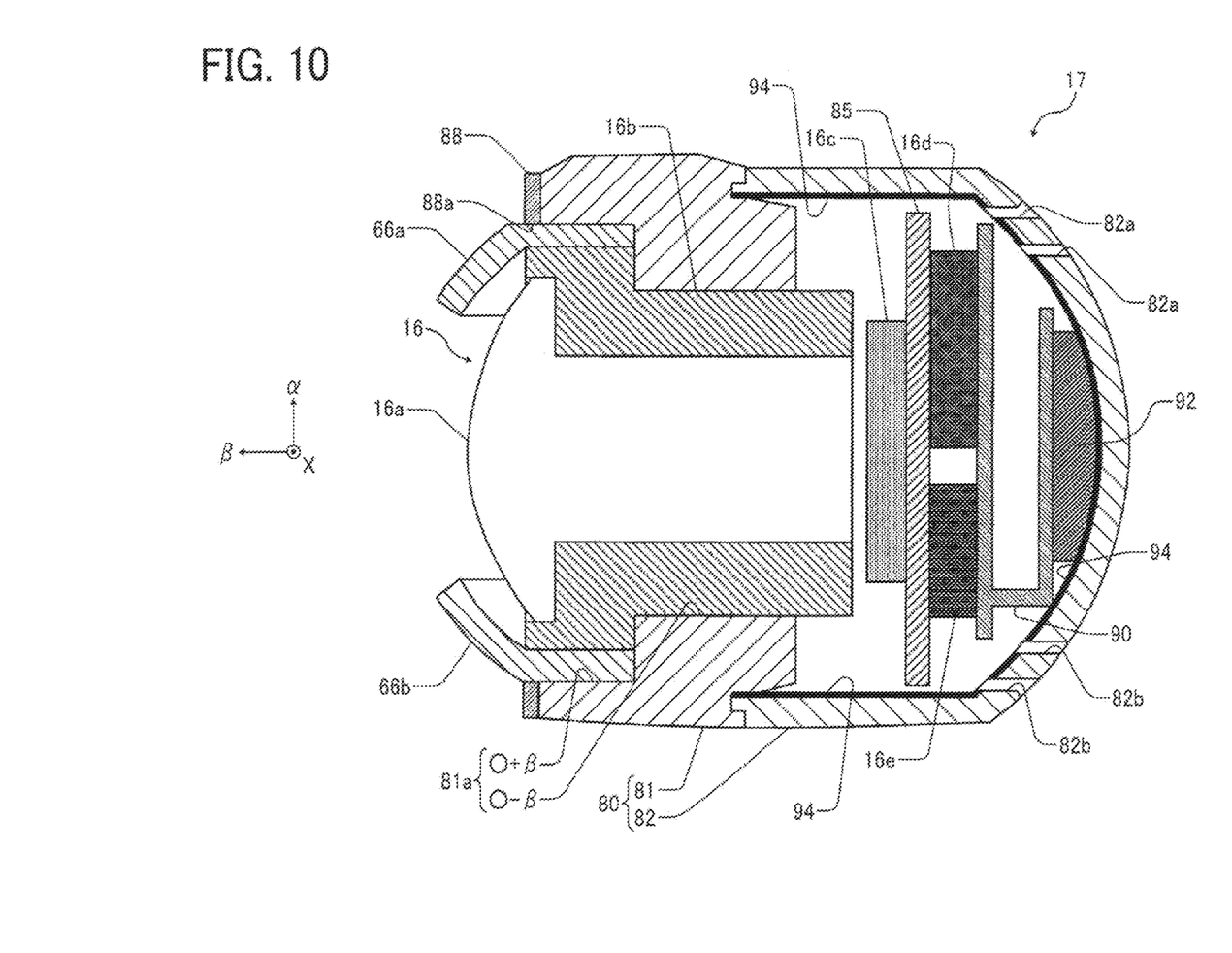
FIG. 10 is a cross-sectional view illustrating the camera module of FIG. 9, when the camera module is cut in αβ plane.

In one example, as illustrated in FIGS. 9A, 9B, and 10, the camera module 17 includes the camera 16, a housing 80 (case), a substrate 85, a radiator 90, and a conductor 92. FIG. 10 is a cross-sectional view of the camera module 17 of FIG. 9, when cut along the αβ plane.

As illustrated in FIGS. 9A and 9B, the housing 80 has an elongated hollow body having the longitudinal length extended in the X axial direction, and includes a front-side (front) cover 81 and a back-side (back) cover 82 that are joined together. The front cover 81 is positioned at the +β side of the back cover 82. The front cover 81 and the back cover 82 are each made of resin that is high in strength and heat resistance, such as engineering plastics. Examples of engineering plastics include, but not limited to, polyacetal, polyamides, polycarbonates, and mixture of polymers such as a mixture of ABS resins and polycarbonates or a mixture of ABS resin and polyamides. The heat conductivity of such engineering plastics is about in the range between 1.0 W/mK and 0.2 W/mK.

As illustrated in FIG. 10, the front cover 81 has a box-like shape, with a longitudinal length extended in the X axial direction and having an opening at the −β side. The front cover 81 has an αβ plane with a U-shaped cross-sectional area. The front cover 81 is further formed with a stepwise opening 81a at a central portion in the X axial direction. The cross-sectional area of the stepwise opening 81a at the +β side ("O+β") is made larger than that of the stepwise opening 81a at the −β side ("O+β").

The front cover 81 has a +β side surface, which is provided with a plate 88. The plate 88 is formed with an opening 88a, which has substantially the same surface area size of that of the +β side opening of the stepwise opening 81a.

The back cover 82 is has a box-like shape, with a longitudinal length extended in the X axial direction and having an operating at the +β side. The back cover 82 has an αβ plane with a U-shaped cross-sectional area. The −β side wall of the back cover 82 is curved so as to form a protrusion from the −β side.

The −β side, surface of the back cover 82 has the +α side, edge portion formed with a plurality of air holes 82a that are arranged in grid. The −β side, surface of the back cover 82 further has the −α side, edge portion formed with a plurality of air holes 82b that are arranged in grid.

The camera 16, which is an electron camera, includes the image capturing lens 16a, a lens holder 16b, an imaging element 16c, a field programmable gate array (FPGA) 16d as a heating element, and a USB controller 16e as a heating element. In this example, the FPGA 16d and the USB controller 16e are each or collectively referred to as the "heating element". The heating element is any object that can generate heat by giving electricity to such as an electronic component.

The image capturing lens 16a has a plurality of lens elements, which is arranged apart from one another in the β direction, so that the optical axes of the lens elements are made in parallel to the β axis. The image capturing lens 16a has a 170 degree, angle of view in the X axial direction, and a 135 degree, angle of view in the a axial direction. The image capturing lens 16a is supported by the lens holder 16b.

The lens holder 16b is joined with a pair of lens protector projections 66a and 66b at the +α side and −α side of the lens holder 16b, respectively, to protect the image capturing lens 16a. The outer faces of the lens protector projections 66a and 66b are curved, such that a user is not most likely to be injured even when the user touches the projection 66a or 66b with a finger.

The lens holder 16b having the pair of lens protector projections 66a and 66b is inserted into the stepwise opening 81a, so that the image capturing lens 16a exposes towards the +β side.

The substrate 85 is provided in parallel to the αX plane, at the −β side of the image capturing lens 16a in the back cover 82 of the housing 80.

In this example, the imaging element 16c is mounted on the +β side, surface of the substrate 85 between the image capturing lens 16a and the substrate 85 in the housing 80. A neutral density (ND) filter may be optionally provided between the image capturing lens 16a and the imaging element 16c.

The imaging element 16c obtains image information of an object via the image capturing lens 16a, converts the image information to an electric signal, and outputs the electric signal to the image input I/F 112 through the USB controller 16e. The imaging element 16c may be implemented by, for example, CCD or CMOS. The USB controller 16e may be mounted on the −β side, surface of the substrate 85.

The FPGA 16d may be mounted on the −β side, surface of the substrate 85, and controls entire operation of the camera 16.

The radiator 90 may be mounted on the −β side of the FPGA 16d and the USB controller 16e, so as to be in contact with the FPGA 16d and the USB controller 16e. In this example, the radiator 90 may be made of metal or alloy, and has a heat conductivity of equal to or greater than 140 W/mK.

The inner walls of the back cover 82, that is, the inner walls of the −β side, +α side, −α side, +X side, and −X side, are applied with heat conductive coating material 94, which functions as a heat conductor. The heat conductive coating material 94 is applied on a portion of the inner walls of the back cover 82 that is adjacent to the plurality of air holes 82a and 82b. The heat conductive coating material 94 may contain, for example, at least one of metallic oxide, metallic nitride, metallic carbide, and metallic hydroxide, including, for example, a carbon fiber filler, metal, aluminum oxide, boron nitride, aluminum nitride, magnesium oxide, zinc oxide, silicon carbide, quartz or aluminum hydroxide. More specifically, the heat conductive coating material 94 has a heat conductivity higher than that of engineering plastics of the front cover 81 or the back cover 82. For example, the heat conductivity of the heat conductive coating material 94 may be equal to or greater than 3.0 W/mK.

The heat conductive coating material 94 may be made of, for example, metallic oxide such as aluminum oxide, magnesium oxide, or zinc oxide, metallic nitride such as boron nitride and aluminum nitride, metallic carbide such as silicon carbide, and metallic hydroxide such as aluminum hydroxide.

The heat conductor 92, which is connected to the radiator 90, is provided at the −β side of the radiator 90. The −β side, surface of the heat conductor 92 contacts the heat conductive coating material 94. In this example, the heat conductor 92 is made of, for example, metal or alloy.

With this configuration, the heats generated by two heating elements (FPGA 16d and USB controller 16e), are transmitted to the heat conductive coating material 94, through the radiator 90 and the heat conductor 92, are diffused over the inner walls of the back cover 82, and are output to the outside through the back cover 82 and the air holes 82a and 82b. The radiator 90 and the heat conductor 92, which are provided between the heating elements and the heat conductive coating material 94, function as a heat transmitter that transmits the heats generated by the heating elements to the heat conductive coating material 94.

The heats generated by the heating elements are soon diffused, without being partially remained, to be output to the outside.

Referring to FIG. 11, example operation of using the videoconference apparatus 100 to have videoconference is explained. In this example, the videoconference apparatus 100 is provided at each site to have videoconference among a plurality of remotely located sites. In FIG. 11, three users are participating in videoconference at one site.

As illustrated in FIG. 11, the users may sit at the +X side, −X side, and −Y side of a table T. The videoconference apparatus 100 may be placed on the table T, such that the operation panel 10b faces the −Y side. The videoconference apparatus 100 may be firstly placed in the reference state.

More specifically, the videoconference apparatus 100 is placed at the +Y edge portion of the top surface of the table T, such that the camera 16 is able to take images of all of three users.

After placing the videoconference apparatus 100 at any desired position on the table T, the user may rotate the second housing 12 with respect to the first housing 10 along the X axial direction in about φ degrees, while φ being any value between 60 degrees and 90 degrees. The display 14 is lifted up from the first housing 10 to face towards the −Y direction, such that the users can see the display 14 from the −Y direction. The image capturing lens 16a, the speaker 18, and the microphone 20 are adjusted to have a height that is about the same height of the user face. With this position, the image capturing lens 16a faces the −Y direction. The speaker 18 outputs sounds to the −Y direction, and the microphone 20 is input with sounds from the +Y direction.

The user plugs in a power code to the outside power source to supply electricity to the videoconference apparatus 100, for example, by connecting between the power supply terminal 44 and the outside power source. The user may further connects a cable to the videoconference apparatus 100 to be ready for communication, for example, by connecting the LAN terminal 38 with the cable for the Internet connection.

The user presses the electric power key 48 to turn on the videoconference apparatus 100. As the videoconference apparatus 100 is turned on, the display 14 displays a menu screen. The menu screen includes various icons and characters, which relate to various instructions such as an instruction for adjusting, and an instruction for starting videoconference (2-way communication), etc. In this example, it is assumed that the user operates the curser 52 to select an icon that instructs to start videoconference, and confirms the selection by pressing the confirmation key 54.

When the instruction for starting videoconference is input, the display 14 of the videoconference apparatus 100 displays a contact list on the menu screen, which lists one or more candidates of counterpart sites (counterpart videoconference apparatuses 100) to start communication. The user may operate the curser 52 to select one counterpart site (counterpart videoconference apparatus 100) from the contact list, and presses the confirmation key 54 to confirm the selection of the counterpart site. With this selection, the videoconference apparatus 100 at one site sends a request for starting communication with the selected site, to the counterpart videoconference apparatus 100 at the selected site.

The counterpart videoconference apparatus 100 at the selected site, which receives the request for starting communication, causes the display 14 to display a message on a menu screen. The message includes an item indicating that the request is accepted, and an item indicating that the request is rejected.

The user at the selected site operates the curser 52 and the confirmation key 54 of the counterpart videoconference apparatus 100, to select whether to accept or reject the request. Assuming that the request is accepted, the videoconference apparatus 100 starts communication with the counterpart videoconference apparatus 100 through a network such as the Internet.

More specifically, an image of the user, which is taken by the camera 16 of the videoconference apparatus 100, is transmitted to the counterpart videoconference apparatus 100 through the network, for display through the display 14 of the counterpart videoconference apparatus 100.

The sounds of the user, which is picked up by the microphone 20 of the videoconference apparatus 100, is transmitted to the counterpart videoconference apparatus 100 through the network, for output through the speaker 18 of the counterpart videoconference apparatus 100.

In this manner, videoconference can be carried out between or among the videoconference apparatuses 100 to transmit or receive image data or sound data.

As described above referring to FIG. 10, the camera module 17 is an electronic device, which is provided with the housing 80 that accommodates therein two heating elements, the FPGA 16d and the USB controller 16e. The inner walls of the housing 80 are coated with the heat conductive coating layer 94.

With this configuration, the heats generated by the heating elements are transmitted to the heat conductive coating material 94, are diffused over the inner walls of the housing 80, and are output to the outside through the housing 80.

Accordingly, the heats generated by the heating elements can be diffused at higher speeds, without requiring the use of heat conductive material (such as metal or alloy) as a material of the housing 80 that may be touched by the user. Since the temperature of the housing 80 does not increase so much, the outer surface of the housing 80 does not have to be covered with a heat insulating material to protect the user.

This allows the camera module 17 (electronic device) to aesthetically enhance outer appearance, while diffusing the heats generated by the heating elements at higher speeds.

If a housing made of metal is used, the outer surface of the housing may need to be covered with a heat insulating material. With the heat insulating material, the outer appearance of the electronic device usually suffers. While the heat insulating material may be made thin, this may result in lower efficiency in heat diffusion. Without the need for heat insulating material, it is possible to aesthetically enhance outer appearance of the camera module 17.

With the camera module 17, the heats generated by the heating elements can be effectively diffused, while preventing the inner portion of the housing 80 from partially increasing the temperature. This further suppresses an operation error or a trouble of the electronic parts, such as the imaging element 16c, the FPGA 16d, and the USB controller 16e.

The heat conductive coating material 94 has a heat conductivity that is higher than that of the housing 80. This suppresses the heats generated by the heating elements to transmit to the outer surface of the housing 80. Accordingly, the user would not feel uncomfortable (hot) when the user touches the housing 80.

The heat conductive coating layer 94 is applied to at least a part of the inner walls of the housing 80. This increases work efficiency, when compared to the case in which a sheet-like heat conductive material is applied to the entire inner walls of the housing 80.

The camera module 17 is further provided with the radiator 90 and the heat conductor 92, between the heating elements and the heat conductive coating layer 94 of the housing 80. With the radiator 90 and the heat conductor 92 that transmit heats, the heats generated by the heating elements are transmitted to the heat conductive coating layer 94 with improved efficiency.

The housing 80 is further provided with air holes 82a and 82b, adjacent to the heat conductive coating layer 94, through which the heats transmitted to the heat conductive coating layer 94 can be output to the outside through the air holes 82a and 82b. This further increases efficiency in heat diffusion.

The heat conductive coating layer 94 contains metal, such that the heats are diffused over the inner walls of the housing 80 with improved efficiency.

The housing 80 is made of resin, such that the heats are hardly transmitted to the outer surface of the housing 80.

The camera module 17 includes the image capturing lens 16a that is held so as to partially expose from the housing 80, and the imaging element 16c that obtains image information of an object using the image capturing lens 16a. With the above-described configuration, the camera module 17 provides high quality in terms of safety, reliability, and design.

The videoconference apparatus 100 includes the camera module 17, and the network I/F that transmits the image information obtained by the imaging element 16c of the camera module 17 through the network such as the Internet. With the above-described configuration, the videoconference apparatus 100 provides high quality in terms of safety and design, while allowing stable transmission of high-quality image information.

The camera module 17 can be freely attached to or removed from the second housing 12, such that it would be easier to repair, maintain, exchange with a new module, or exchange a part.

In the above-described embodiment, the camera module 17 of the videoconference apparatus 100 is explained as one example of electronic device. Alternatively, any desired electronic device having a housing that accommodates a heating element may be used. For example, a digital camera, personal computer, television, audio equipment, or home appliance may be used.

In the above-described embodiment, the camera module 17 as one example of electronic device includes two heating elements (the FPGA 16d and the USB controller 16e) in the housing 80. Alternatively, any desired number or type of heating element, such as electronic part, may be provided in the housing 80.

In the above-described embodiment, the heat conductive coating material 94 is applied to the inner walls of the housing 80. Alternatively, the heat conductive coating material 94 may be applied to at least a part of the inner walls of the housing 80. More specifically, a heat conductive sheet or a heat conductive film may be applied to the inner walls of the housing 80.

Alternatively, a heat conductive panel may be applied to the inner walls of the housing 80. Alternatively, heat conductive grease may be applied to the inner walls of the housing 80.

In the above-described embodiment, the inner walls of the housing 80, that is, the inner walls of the +α side, −α side, −β side, +X side, and −X side, are applied with the heat conductive coating material 94. Alternatively, the inner wall of at least one side may be applied with the heat conductive coating material 94. It is preferable to apply the heat conductive coating material 94 to at least the inner wall of the −β side of the housing 80.

In the above-described embodiment, the radiator 90 and the heat conductor 92 have the function of transmitting heats. Alternatively, any desired number of parts, such as one or more than two, may provide the function of transmitting heats.

In the above-described embodiment, the housing is made of two parts (the front cover 81 and the back cover 82). Alternatively, any desired number of parts, such as one or more than two, may make up the housing. In any case, at least a part of the inner walls of the housing is applied with the heat conductive coating material.

In the above-described embodiment, the heat conductive coating material that functions as a heat conductor, contains metal. Alternatively, the heat conductive coating material may be made of a conductive carbon compound that does not contain metal. Preferably, any desired material having a heat conductivity higher than that of the housing can be used.

In alternative to resin such as plastics, the housing may be made of any desired material other than resin.

The above-described housing may be implemented in various other ways. For example, the shape or the size of the housing may not be limited to the above-described example. Further, the shape, position, size, or number of the air holes are not limited to the above-described example.

In the above-described embodiment, the display 14 is implemented by a LCD display. Alternatively, the display 14 may be implemented by a plasma display, EL display, or any other desired display.

In the above-described embodiment, the videoconference apparatus 100 is used within a room. The videoconference apparatus 100 does not have to be fixed in a specific room, as the videoconference apparatus 100 is portable. The videoconference apparatus 100 may be carried around to be used at any desired place.

In alternative to the portable-type videoconference apparatus 100, any videoconference apparatus that can hardly be moved may be used.

In the above-described embodiment, the videoconference apparatus 100 is used as one example of communication apparatus. Alternatively, a teleconference apparatus that transmits or receives only sound data through a telephone communication network may be used. The communication apparatus could be thus any desired communication apparatus capable of sharing information through a network.

Numerous additional modifications and variations are possible in light of the above teachings. It is therefore to be understood that within the scope of the appended claims, the disclosure of the present invention may be practiced otherwise than as specifically described herein.

With some embodiments of the present invention having thus been described, it will be obvious that the same may be varied in many ways. Such variations are not to be regarded as a departure from the spirit and scope of the present invention, and all such modifications are intended to be included within the scope of the present invention.

Further, any of the above-described devices or units can be implemented as a hardware apparatus, such as a special-purpose circuit or device, or as a hardware/software combination, such as a processor executing a software program.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, nonvolatile memory cards, ROM (read-only-memory), etc.

Alternatively, any one of the above-described and other methods of the present invention may be implemented by ASIC, prepared by interconnecting an appropriate network of conventional component circuits or by a combination thereof with one or more conventional general purpose microprocessors and/or signal processors programmed accordingly.

What is claimed is:

1. An electronic device, comprising:
a housing having a round shape, an inner surface of the housing including a heat conductive material;
at least one heating element disposed within the housing;
a radiator, disposed within the housing, which thermally contacts the at least one heating element, the radiator including different lengths; and
a heat conductor which contacts the radiator and the heat conductive material of the inner surface of the housing,
wherein a length of the radiator at the heat conductor side is smaller than a length of the radiator at a side of the at least one heating element, and
wherein a length of the heat conductor is smaller than the length of the radiator at the heat conductor side.

2. The electronic device of claim 1, wherein the heat conductive material has a heat conductivity higher than that of the housing.

3. The electronic device of claim 1, wherein the housing includes:
at least one air hole adjacent to the heat conductive material.

4. The electronic device of claim 1, wherein the heat conductive material includes metal.

5. The electronic device of claim 1, wherein the housing comprises resin.

6. The electronic device of claim 1, further comprising:
an image capturing lens supported by the housing so as to be partially exposed from the housing; and
an imaging element provided in the housing and configured to obtain image information of an object using the image capturing lens.

7. A communication apparatus, comprising:
the electronic device of claim 6; and
a transmitter to transmit the image information obtained by the imaging element of the electronic device, through a network.

* * * * *